(12) United States Patent
Shyu et al.

(10) Patent No.: US 10,056,443 B2
(45) Date of Patent: Aug. 21, 2018

(54) ELECTRONIC DEVICES WITH DISPLAYS

(71) Applicant: Apple Inc., Cupertino, CA (US)

(72) Inventors: Terry C. Shyu, Mountain View, CA (US); Paul S. Drzaic, Morgan Hill, CA (US); Zhen Zhang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/251,612

(22) Filed: Aug. 30, 2016

(65) Prior Publication Data

US 2017/0294495 A1    Oct. 12, 2017

Related U.S. Application Data

(60) Provisional application No. 62/320,333, filed on Apr. 8, 2016.

(51) Int. Cl.
| | |
|---|---|
| *H01L 27/32* | (2006.01) |
| *G06F 3/041* | (2006.01) |
| *H01L 51/00* | (2006.01) |
| *H01L 51/52* | (2006.01) |
| *G06F 3/044* | (2006.01) |

(52) U.S. Cl.
CPC .......... *H01L 27/3248* (2013.01); *G06F 3/041* (2013.01); *H01L 27/323* (2013.01); *H01L 27/3211* (2013.01); *H01L 27/3276* (2013.01); *H01L 51/0097* (2013.01); *H01L 51/5243* (2013.01); *G06F 3/044* (2013.01); *G06F 2203/04102* (2013.01); *H01L 51/5281* (2013.01); *H01L 2251/5338* (2013.01)

(58) Field of Classification Search
CPC . H01L 27/3248; H01L 27/3211; H01L 27/323
See application file for complete search history.

(56) References Cited

U.S. PATENT DOCUMENTS

| | | |
|---|---|---|
| 9,287,329 B1 | 3/2016 | Lee et al. |
| 2013/0249740 A1 | 9/2013 | Shedletsky |

(Continued)

FOREIGN PATENT DOCUMENTS

| | | |
|---|---|---|
| CN | 104600208 | 5/2015 |
| JP | 2015143843 | 8/2015 |
| WO | 2016123984 | 8/2016 |

OTHER PUBLICATIONS

Chen, Janglin et al., Technology Advances in Flexible Displays and Substrates, IEEE Access, May 10, 2013, pp. 150-158, vol. 1.
Ai et al., U.S. Appl. No. 15/177,025, filed Jun. 8, 2016.

*Primary Examiner* — Douglas Menz
(74) *Attorney, Agent, or Firm* — Treyz Law Group, P.C.; G. Victor Treyz

(57) ABSTRACT

An electronic device may have a flexible portion that allows the device to be folded. The device may have a flexible display. The flexible display may have edge portions that are joined along a flexible middle portion. The flexible middle portion may overlap a bend axis and may be bent about the bend axis. Flexibility enhancement regions may be formed in a backing layer, polarizer layer, organic-light-emitting display layer, and other display layers to enhance flexibility for the middle portion. The device may have a display with a flexible tail that is bent about a bend axis. Metal trace on the flexible display may include metal trace strips that serve as power lines. Flexibility enhancement regions such as slot-shaped openings or other openings may be formed in the metal trace strips to enhance flexibility.

16 Claims, 15 Drawing Sheets

(56) References Cited

U.S. PATENT DOCUMENTS

| | | |
|---|---|---|
| 2013/0300284 A1 | 11/2013 | Nishido |
| 2015/0036299 A1 | 2/2015 | Namkung et al. |
| 2015/0138041 A1 | 5/2015 | Hirakata et al. |
| 2016/0098132 A1 | 4/2016 | Kim et al. |
| 2016/0105950 A1 | 4/2016 | Drzaic et al. |
| 2016/0181572 A1 | 6/2016 | Prushinskiy et al. |
| 2017/0092884 A1 | 3/2017 | Zhang et al. |

ELECTRONIC DEVICES WITH DISPLAYS

This application claims priority to provisional patent application No. 62/320,333, filed Apr. 8, 2016, which is hereby incorporated by reference herein in its entirety.

BACKGROUND

This relates generally to electronic devices and, more particularly, to electronic devices with displays.

Electronic devices often include displays. For example, computers, cellular telephones, and other devices may use displays to present visual information to a user. It may be desirable to provide displays with flexible portions. This may allow portions of a display to be bent. Care must be taken, however, to ensure that displays are sufficiently robust to avoid damage when bent.

SUMMARY

An electronic device may have a flexible portion that allows the device to be folded. The device may have a flexible display and a housing in which the flexible display is mounted.

The housing and the flexible display may have edge portions that are joined along a flexible middle portion. The flexible middle portion may overlap a bend axis. The housing and flexible display may be bent about the bend axis. Flexibility enhancement regions may be formed in a backing layer, polarizer layer, a display layer such as an organic-light-emitting display layer or micro-light-emitting diode display layer, and may be formed in adhesive layers and other layers within the display to enhance bending about the bend axis.

The device may have a display with a flexible tail. The flexible tail may be bent about a bend axis when the display is mounted in a housing. Metal trace on the flexible display may include metal trace strips that serve as power lines. Flexibility enhancement regions such as slot-shaped openings or other openings may be formed in portions of the metal trace strips that overlap across the bend axis.

DETAILED DESCRIPTION

Figure 1:
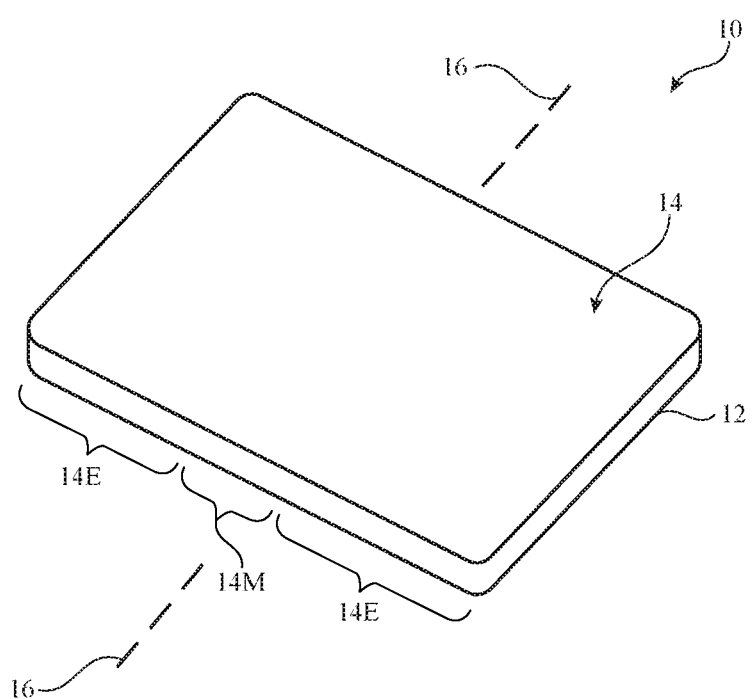
FIG. 1 is a perspective view of an illustrative electronic device with a display in accordance with an embodiment.

An electronic device such as electronic device 10 of FIG. 1 may have a display such as display 14. Device 10 may be a laptop computer, a tablet computer, a cellular telephone, a wristwatch, or other electronic device (e.g., a portable device, handheld device, etc.).

Display 14 may be mounted in a housing such as housing 12. Housing 12 may be formed of plastic, glass, ceramics, fiber composites, metal (e.g., stainless steel, aluminum, etc.), other suitable materials, or a combination of any two or more of these materials.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures (as an example).

Display 14 may include an array of display pixels formed from liquid crystal display (LCD) components, an array of electrophoretic display pixels, an array of plasma display pixels, an array of organic light-emitting diode display pixels, an array of pixels formed from crystalline semiconductor light-emitting diode dies (sometimes referred to as micro-LEDs), an array of electrowetting display pixels, or display pixels based on other display technologies. Examples in which display 14 has been formed from organic light-emitting diode pixels or micro-LED pixels may sometimes be described herein as an example).

Display 14 may have one or more portions that bend. The bent portions may be flexed back and forth during use of device 10 (e.g., when device 10 is being opened and closed like a book) or may be placed in a permanent bent configuration (e.g., when an inactive portion of display 14 is bent to accommodate mounting in a compact housing).

In the illustrative example of FIG. 1, device 10 is bendable (foldable) along bend axis 16. To accommodate bending about bend axis 16, display 14 and housing 12 may have a flexible portion that overlaps bend axis 16. For example, display 14 may have a flexible central portion 14M and housing 12 may have an associated bendable central portion that runs along bend axis 16. Bendable portion 14M may be interposed between edge portions 14E of display 14. Edge portions 14E may be rigid or flexible. For example, edge portions 14E may be flexible display portions that are held rigid by rigid edge portions of housing 12. Display 14 may be folded so that display portions 14E face each other and/or so that portions 14E face away from each other.

Figure 2:
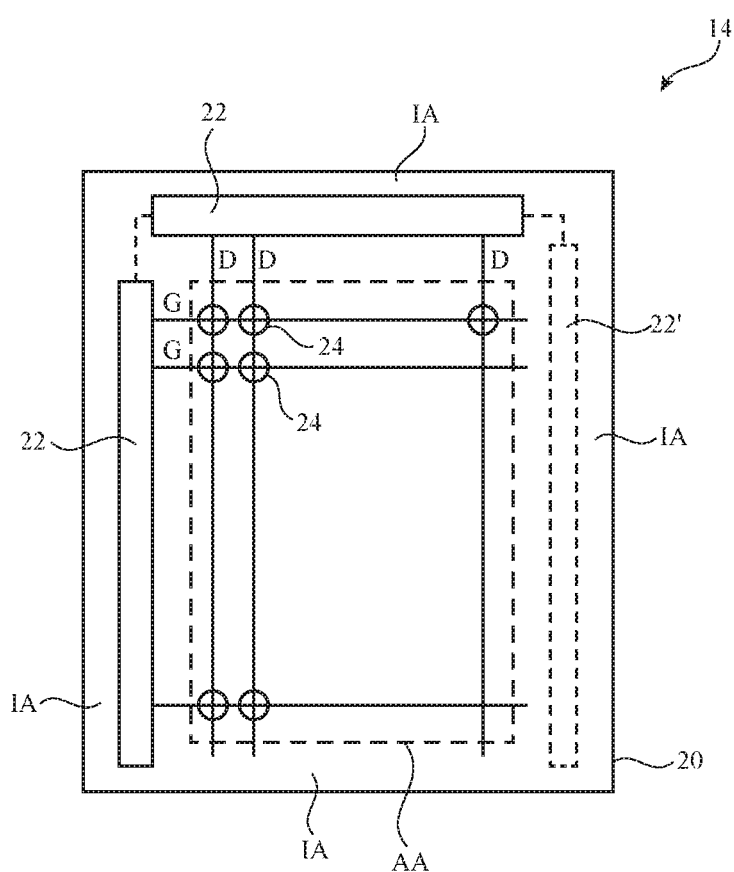
FIG. 2 is a schematic diagram of an illustrative display in accordance with an embodiment.

FIG. 2 is a diagram of an illustrative display. As shown in FIG. 2, display 14 may have an array of pixels 24 formed on a substrate such as substrate 20. Display driver circuitry 22 may include gate driver circuitry that is used to supply control signals G (sometimes referred to as horizontal control signals, emission control signals, scan signals, gate line signals, etc.) on horizontal lines (sometimes referred to as gate lines). There may be one or more gate lines associated with each row of pixels 24. Gate driver circuitry may be located along one edge of display 14 (e.g., the left edge of display 14) and/or two edges of display 14 (see, e.g., illustrative gate driver circuitry 22' on the right edge of display 14 in the example of FIG. 2). While control signals are being supplied to rows of pixels 24 using gate lines G, display driver circuitry 22 may be used to supply data signals D to pixels 24 using data lines that run along respective columns of pixels 24. During operation, the active area AA of display 14, which contains pixels 24, displays images for a user. The inactive area IA of display 14 that runs along the borders of active area AA does not have any pixels 24 and therefore does not display images. Circuitry such as display driver circuitry 22, routing lines, and other non-pixel circuitry may be located in inactive area IA.

Figure 3:
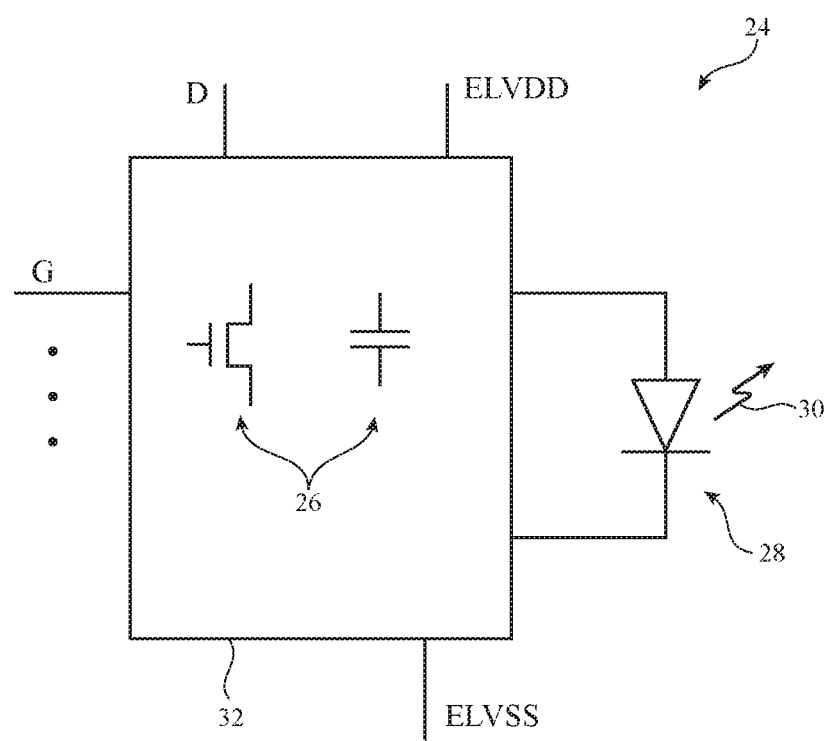
FIG. 3 is a circuit diagram of an illustrative pixel in a display in accordance with an embodiment.

An illustrative circuit of the type that may be used for pixels 24 is shown in FIG. 3. As shown in FIG. 3, pixel 24 may have pixel control circuitry 32 and light-emitting diode 28. Control circuitry 32 may receive data signals D on vertical data lines and may receive control signals G on one or more horizontal control lines (gate lines). Control circuitry 32 may contain switching transistors, emission enable transistors, a drive transistor that controls current flow through light-emitting diode 28, capacitors, and other circuitry (see, e.g., illustrative transistor and capacitor circuitry 26). Power lines such as metal traces on display substrate 20 may carry positive power supply signal ELVDD and ground power supply signal ELVSS. Signals ELVDD and ELVSS may be used to power circuitry 32. During operation, current is supplied to diode 28 that is proportional to the data loaded into circuitry 32, causing diode 28 to emit a desired amount of light 30. Pixels 24 may contain light-emitting diodes 28 of different colors (e.g., red, green, and blue) so that display 14 has the ability to display color images.

Light-emitting diode 28 and circuitry 32 may, if desired, be formed from thin-film circuitry. As shown in the illustrative cross-sectional side view of display 14 of FIG. 4, for example, display 14 may have an array of pixels 24 that are formed from thin-film layers (thin-film circuitry) 34 on substrate 36. In this type of thin-film display arrangement, light-emitting diode 28 may be an organic light-emitting diode and substrate 36 may be a flexible polymer substrate. Configurations in which light-emitting diodes 28 in display 14 are formed from discrete semiconductor dies may also be used (see, e.g., display 14 of FIG. 5 in which packaged or unpackaged micro-LEDs 24P have been coupled to traces 38 on flexible polymer substrate 36).

Figure 4:
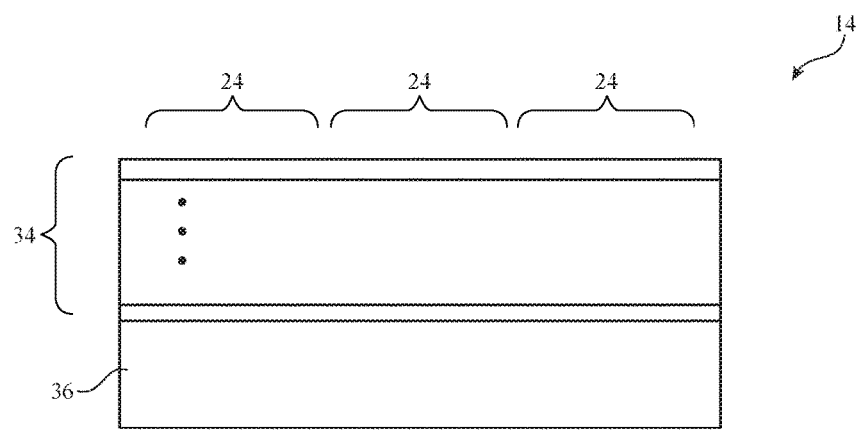
FIG. 4 is a cross-sectional side view of an illustrative organic light-emitting diode display in accordance with an embodiment.
Figure 5:
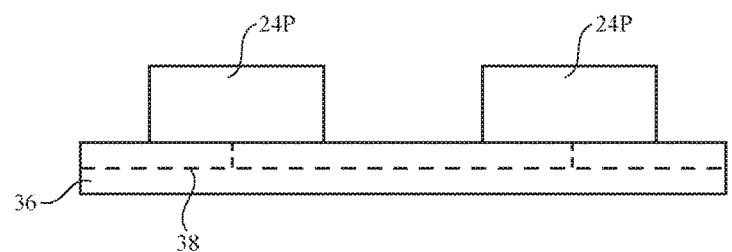
FIG. 5 is a cross-sectional side view of an illustrative display with light-emitting diode pixels formed from individual crystalline semiconductor light-emitting diode dies in accordance with an embodiment.
Figure 6:
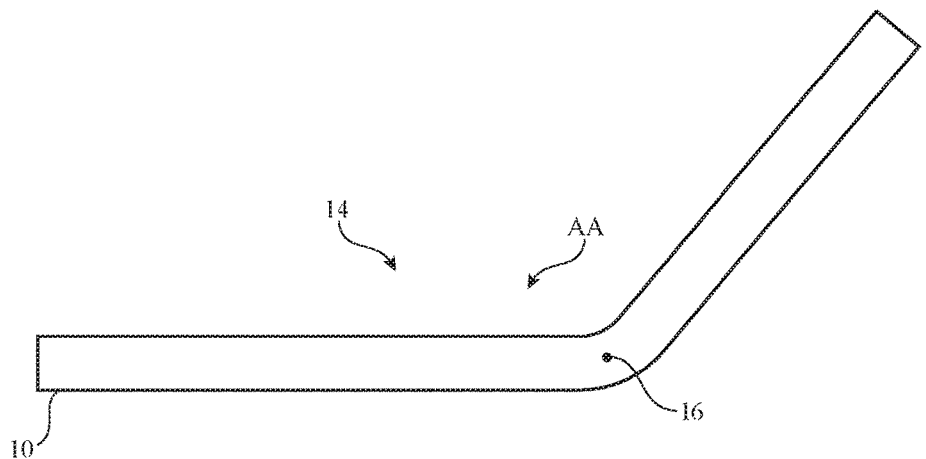
FIG. 6 is a side view of an illustrative display with a bend in an active area of the display in accordance with an embodiment.
Figure 7:
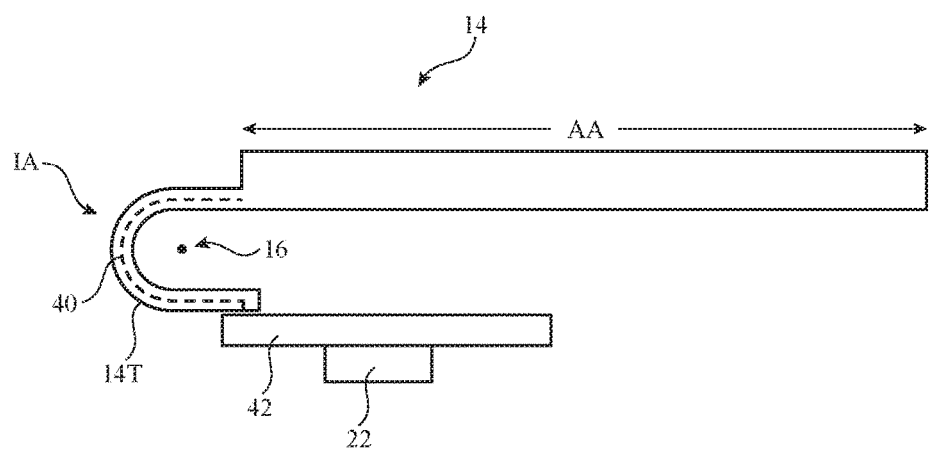
FIG. 7 is a side view of an illustrative display with a bend in an inactive area of the display in accordance with an embodiment.

Displays such as illustrative displays 14 of FIGS. 4 and 5 may be bent about bend axis 16, as illustrated in the display side views of FIGS. 6 and 7. In the example of FIG. 6, bend axis 16 overlaps active area AA of display 14. When a user desires to fold display 14 for storage or to otherwise adjust display 14 in this type of configuration, active area AA of display 14 may be bent along bend axis 16. In the example of FIG. 7, inactive area IA of display 14 has been bent about bend axis 16. As shown in FIG. 7, display driver circuitry 22 (e.g., one or more display driver integrated circuit dies) may be mounted to printed circuit 42. Printed circuit 42, in turn, may be coupled to traces 40 in flexible tail portion 14T in inactive area IA of display 14. Inactive tail portion 14T of display 14 may be a thin extending portion of one or more flexible polymer layers or other layers in active area AA of display 14 and may bend about bend axis 16 to accommodate the mounting of display 14 of FIG. 7 in a compact enclosure (as an example).

To accommodate either one-time bending or repeated folding and unfolding, the portions of display 14 that bend are preferably resistant to damage (e.g., cracking of brittle layers, plastic deformation, delamination, etc.). To help enhance durability, display 14 may be provided with enhanced flexibility regions. These regions may take the form of slots or other openings in the layers of display 14 and may help reduce potentially damaging stresses in one or more of the layers of display 14 during bending.

Figure 8:
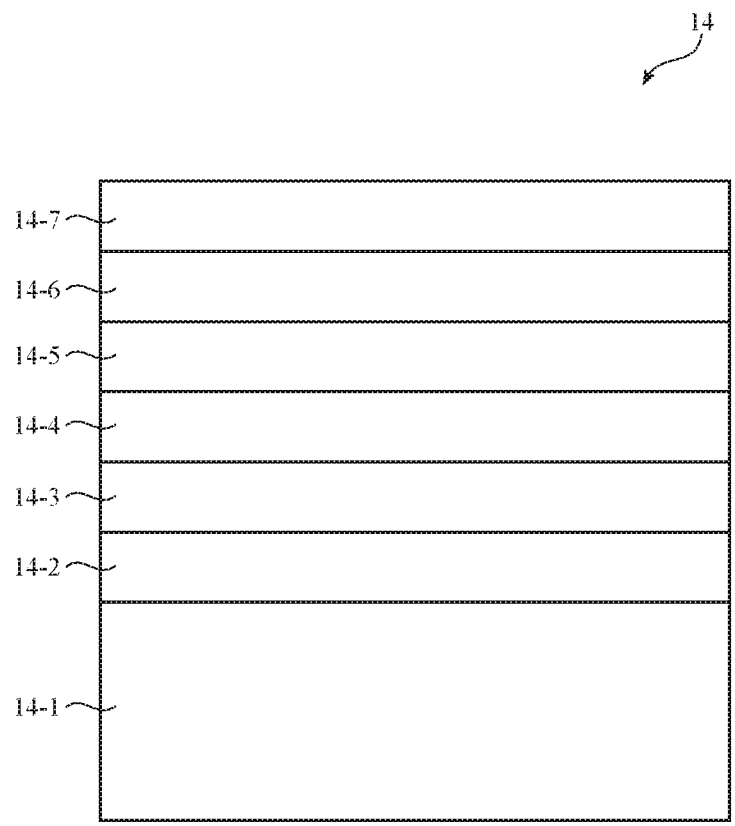
FIG. 8 is a cross-sectional side view of an illustrative display in accordance with an embodiment.

Display 14 may have a separate touch sensor layer, may have touch sensor structures that are formed from conductive traces on the same substrate as the circuitry that forms pixels 24, or may not be touch sensitive. FIG. 8 is a cross-sectional side view of display 14 in an illustrative configuration in which display 14 has a touch sensor formed on a substrate layer that is attached to a flexible display layer using adhesive. Other configurations may be used for display 14 if desired (e.g., touch and/or protective layers may be omitted, additional layers may be added above or below the display, etc.). The configuration of FIG. 8 is presented as an example.

In the illustrative configuration of FIG. 8, display 14 has a support layer 14-1 (sometimes referred to as substrate, backing layer, or backing film) such as layer 14-1. Layer 14-1 may be, for example, a flexible polymer layer or a thin flexible metal layer (e.g., a nickel titanium layer). Layer 14-2 may be a layer of adhesive that attaches flexible display layer 14-3 to support layer 14-1. Flexible display layer 14-3, which may sometimes be referred to as a flexible display, may be, for example, an organic light-emitting diode display, a micro-LED display, or other flexible display. Adhesive layer 14-4 may be used to attach touch sensor (touch sensor layer) 14-5 to layer 14-3. Touch sensor 14-5 may be formed from transparent conductive capacitive touch sensor electrodes (e.g., indium tin oxide electrodes) on a transparent polymer substrate (as an example). If desired, touch sensor electrodes may be integrated into layer 14-3. Outer layer 14-7 of display 14 may include a polarizer (e.g., a circular polarizer formed from one or more flexible polymer layers to reduce reflections from layer 14-3), an inorganic scratch resistant layer (sometimes referred to as a hard coat), moisture barrier structures, coatings to promote smudge resistance, an antireflection layer, and/or other protective and functional layers. Adhesive layer 14-6 may be used to attach outer layer (polarizer layer) 14-7 to touch sensor 14-5. Adhesive layers in display 14 may be formed from pressure sensitive adhesive, liquid adhesive (e.g., ultraviolet light curable liquid adhesive, etc.), or other suitable adhesive and may, if desired, be optically clear. Flexible substrate layers for support layer 14-1, display layer 14-3, and touch sensor 14-5, may be formed from flexible polymers such as polyimide, polyethylene terephthalate (PET) or other polyesters, acrylic, or other polymers. If desired, metals may be incorporated into the layers of display 14 (e.g., as metal traces on substrates, a thin sheet of metal for forming support layer 14-1 or other layers, etc.). Semiconductor thin-films may be formed in display 14-3 (e.g., to form thin-film transistors). Other materials may also be used in forming one or more layers of display 14 (e.g., nanowires and other nanomaterials, fiber composite materials such as carbon fiber materials, ceramics, glass, etc.).

Figure 9:
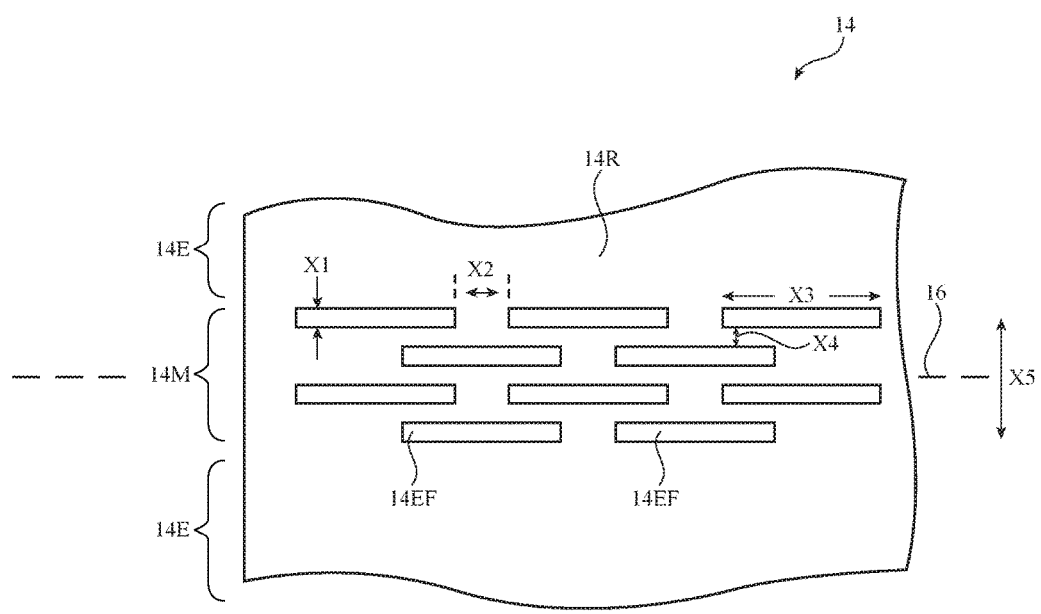
FIGS. 9, 10, 11, 12, and 13 are top views of illustrative bend regions in a display having enhanced flexibility regions in accordance with an embodiment.

To prevent damage to display 14 during bending, one or more of layers 14-1, 14-2, 14-3, 14-4, 14-5, 14-6, and 14-7 and/or other display layers may be provided with flexibility enhancement regions. An illustrative configuration for display 14 in which one or more layers of display 14 have been provided with flexibility enhancement regions is shown in FIG. 9. As shown in FIG. 9, display 14 may have edge portions 14E. Central flexible portion 14M may extend between edge portions 14E. Central flexible portion 14M may run along and overlap bend axis 16.

To enhance the flexibility of display 14 and thereby help reduce bend-induced stresses, solid portion 14R of one or more layers in region 14M may be provided with enhanced flexibility regions 14EF. Regions 14EF may be openings (e.g., through-holes), may be grooves or other recesses, or may have other configurations. In the example of FIG. 9, regions 14EF have elongated slot shapes. Regions 14EF may have dimensions such as widths X1 and lengths X3, may be separated along their lengths by gaps X2 and along their widths by gaps X4. Region 14M may have a width X5. With one illustrative configuration, X1 may be 100 microns, more than 10 microns, or less than 500 microns, X2 may be 5 mm, more than 1 mm, or less than 2 cm, X3 may be 500 microns, more than 100 microns, less than 2 mm, X4 may be 500 microns, more than 100 microns, less than 2 mm, etc., and X5 may be 100 microns to 1 cm, more than 1 mm, or less than 5 mm, and/or these dimensions may have any other suitable values. Slot-shaped elongated openings or other elongated flexibility enhancement regions 14EF such as regions 14EF of FIG. 9 may be staggered (as shown in FIG. 9) to help preserve the structural integrity of the display layer(s) in which regions 14EF have been formed.

Figure 10:
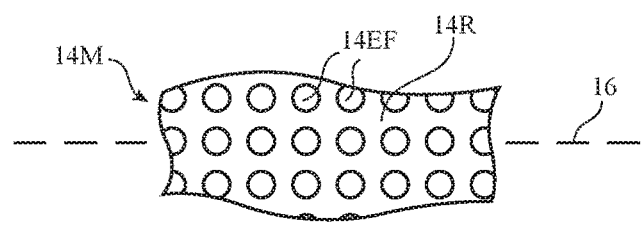
Figure 11:
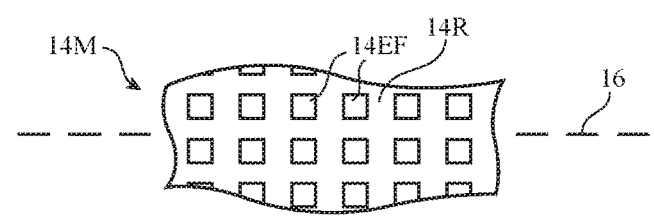
Figure 12:
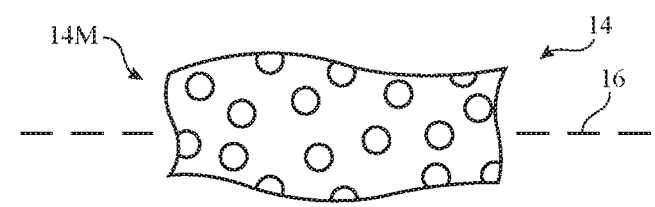
Figure 13:
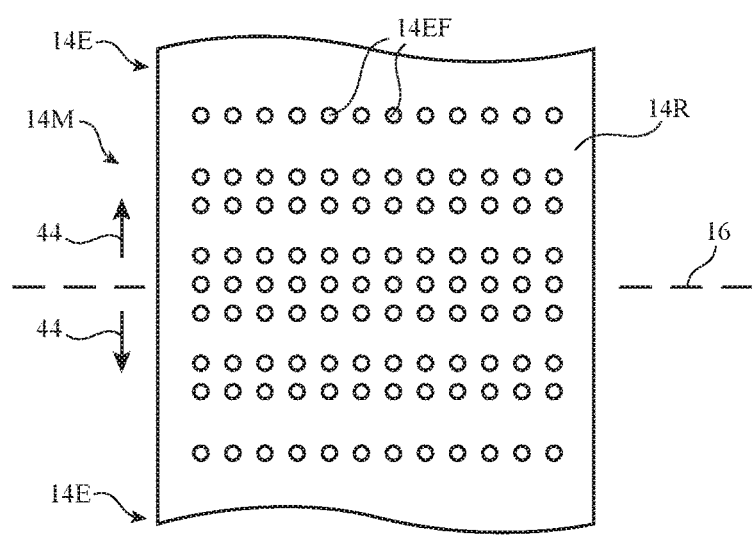

Regions 14EF may be circular (as shown in FIG. 10), may be rectangular (as shown in FIG. 11), or may have any other suitable shape. Regions 14EF may be distributed in a regular periodic pattern (e.g., an array having rows and columns) or may be distributed pseudorandomly (see, e.g., the illustrative aperiodic distribution of FIG. 12). If desired, regions 14EF may be distributed with a density that varies across region 14M (see, e.g., FIG. 13 in which regions 14EF decrease in density with increasing distance 44 from bend axis 16).

Figure 14:
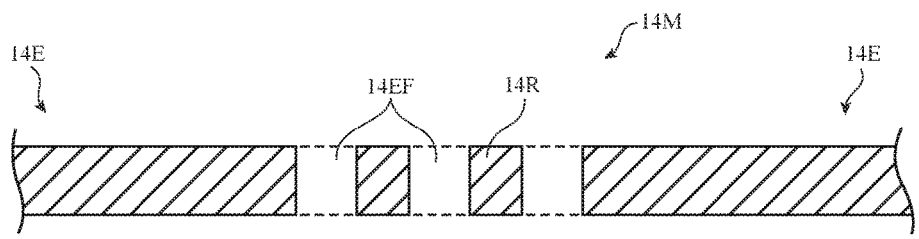
FIGS. 14, 15, 16, and 17 are side views of a display layer showing illustrative configurations for enhanced flexibility regions in a display in accordance with an embodiment.
Figure 15:
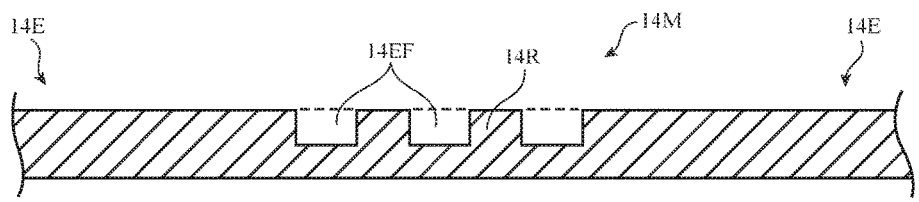
Figure 16:
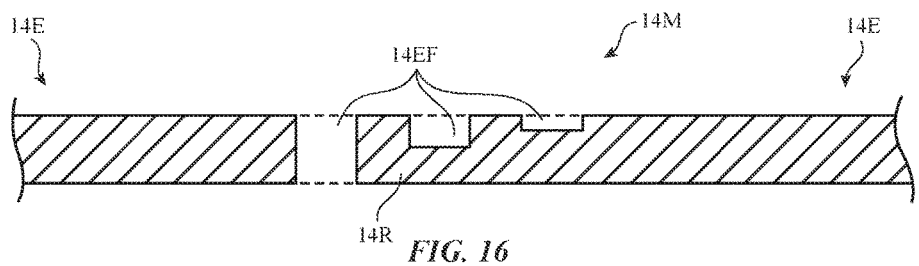
Figure 17:
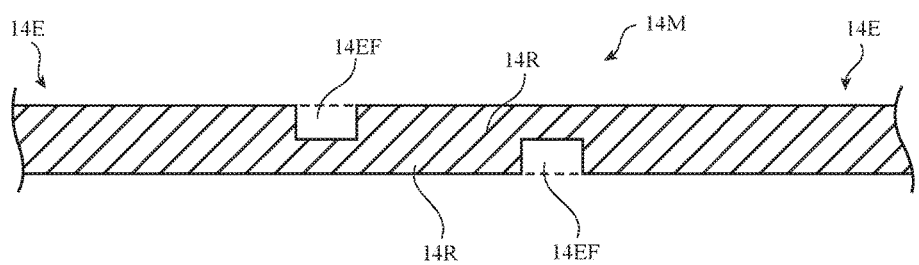

Regions 14EF may pass entirely through a display layer (see, e.g., through-hole openings 14EF of FIG. 14), may pass partly through a display layer (see, e.g., recesses 14EF of FIG. 15), may include through-hole openings and/or recesses of one or more different depths (see, e.g., illustrative regions 14EF of FIG. 15), and/or may be formed on one or more sides of a display layer (see, e.g., FIG. 17).

As shown in FIGS. 14, 15, 16, and 17, regions 14EF may be filled with a flexible material. The flexible material may be a liquid, a gel, foam, a solid polymer (e.g., a soft elastomeric polymer), a liquid polymeric material, or other flexible material. The flexible material in regions 14EF may be formed from a material that is more flexible and/or different than the material of region 12R. If desired, regions 14EF may be filled with air or other gaseous material.

Figure 18:
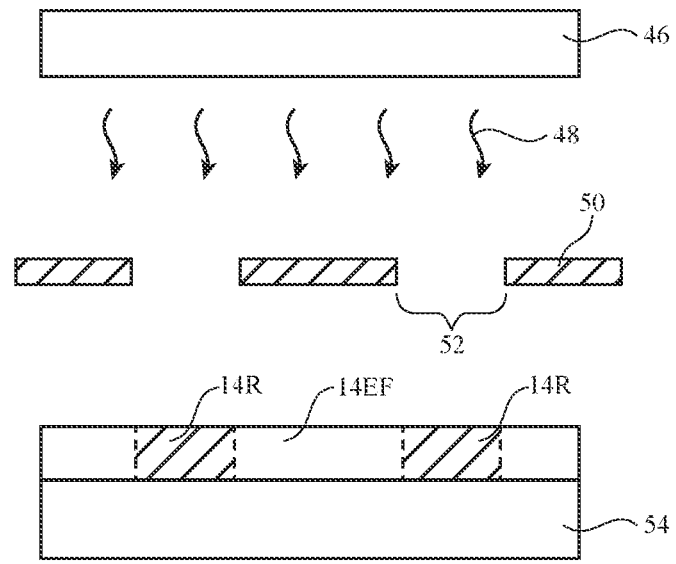
FIG. 18 is a diagram showing how patterned curing techniques may be used in forming a display with enhanced flexibility regions in accordance with an embodiment.
Figure 19:
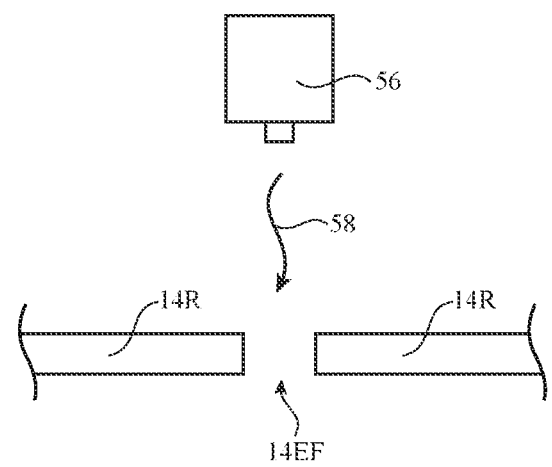
FIG. 19 is a diagram showing how material removal techniques such as laser drilling techniques may be used in forming a display with enhanced flexibility regions in accordance with an embodiment.

FIG. 18 shows how light-source 46 (e.g., an ultraviolet light source) may supply ultraviolet light 48 when processing a display layer. Mask 50 may have openings 52 that allow light 48 to selectively cure a liquid polymer precursor material to form stiffer regions 14R in the display layer. Uncured portions of the liquid polymer material may remain uncured or partly cured and may remain in liquid form or may otherwise be more flexible than cured stiffer regions 14R. This allows the uncured portions to serve as enhanced flexibility regions. If desired, etching equipment, cutting equipment, machining equipment, laser-processing equipment, or other material removal tools may be used in removing portions of a display layer to form regions 14EF (see, e.g., FIG. 19 in which laser 56 produces laser beam 58 to laser drill recesses or openings in layer 14R that serve as enhanced flexibility regions 14EF). After removing material from regions of a display layer, the regions may contain air or may optionally be filled with a material such as liquid, gel, solid polymer (e.g., polymer that is more flexible than the non-removed polymer), or other material that allows the regions to bend.

When filling regions of a layer in display with material to form enhanced flexibility regions 14EF (or when leaving liquid polymer regions uncured), the added material (or uncured material) may be opaque or transparent. Transparent filler materials may be used in scenarios in which image light from pixels 24 is passing through the transparent filler. In situations such as these, the transparent filler material may be index matched to the unremoved portions of the display layer (e.g., the index of refraction of the material that is added to regions 14EF may vary by less than 0.1 or by less than 0.05 or other suitable amount from the index of refraction of remaining material 14R). Index matching may help reduce light scattering.

Figure 20A:
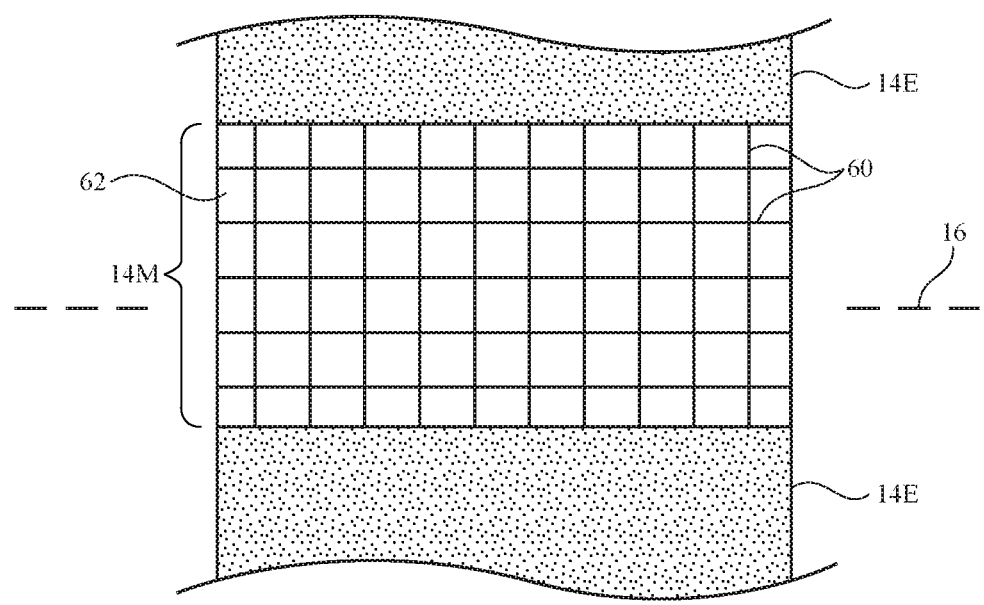
FIGS. 20A and 20B are top views of a display having a mesh structure such as a metal mesh in a bendable portion of the display in accordance with an embodiment.
Figure 20B:
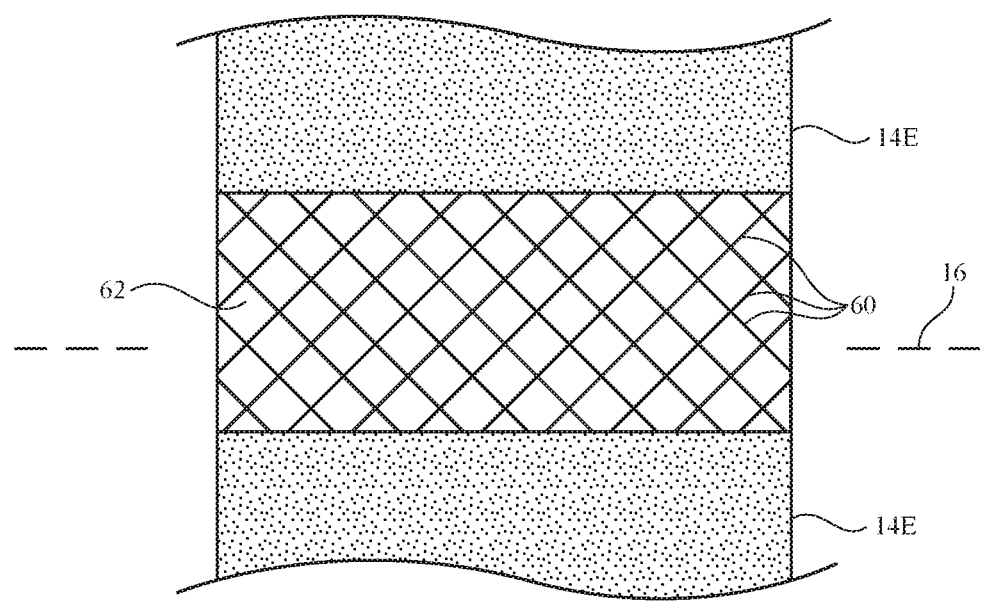

As shown in FIG. 20A, portion 14M of display 14 may have one or more layers with a mesh structure such as grid 60. Grid 60 may be formed from metal wires or a sheet of metal with openings (e.g., an array of rectangular openings or openings of other shapes). The openings in mesh 60 may be filled with air or filler material 62 (e.g., elastomeric material, etc.). Grid 60 may be formed from wires, fine lines of a metal thin-film, or other material. The lines may be sufficiently narrow to be invisible to a user of device 10 and/or grid 60 may be formed in a layer of display 14 that is not visible to the user (see, e.g., backing film 14-1 of FIG. 8). Backing film 14-1 may also be formed from a metal sheet (e.g., a thin sheet of nickel titanium or other flexible metal). To enhance the flexibility of a metal backing film, the metal sheet may be provided with flexibility enhancement regions 14F (e.g., staggered slot-shaped openings, an array of rectangular or circular openings, openings of other shapes, etc.). A metal sheet with grooves or other recesses that pass only partway through the metal sheet may also be used in forming a backing film 14-1. In the example of FIG. 20A, the lines of mesh 60 run parallel and perpendicular to bend axis 16. FIG. 20B shows how the lines of mesh 60 may be oriented so that they run at 45° relative to bend axis 16. Other mesh orientations and layouts may be used if desired. Fiber-based materials may also be used in forming layers in display 14. For example, backing layer 14-1 may be formed from a flexible fiberglass layer or other fiber-impregnated material (e.g., an elastomeric material with glass or carbon fibers, etc.).

Figure 21A:
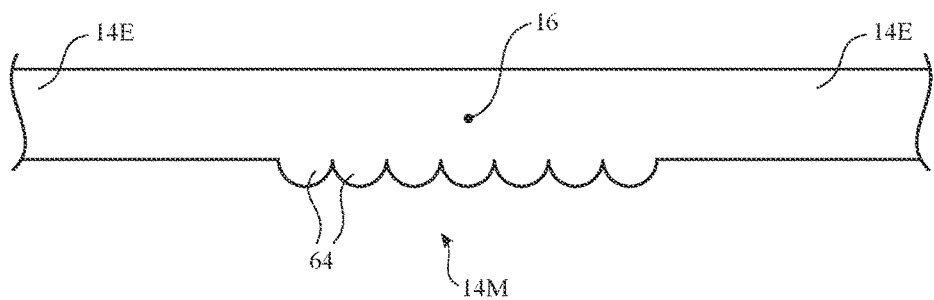
FIGS. 21A and 21B are side views of a display having ribs that extend parallel to a bend axis in a bendable portion of the display in accordance with an embodiment.
Figure 21B:
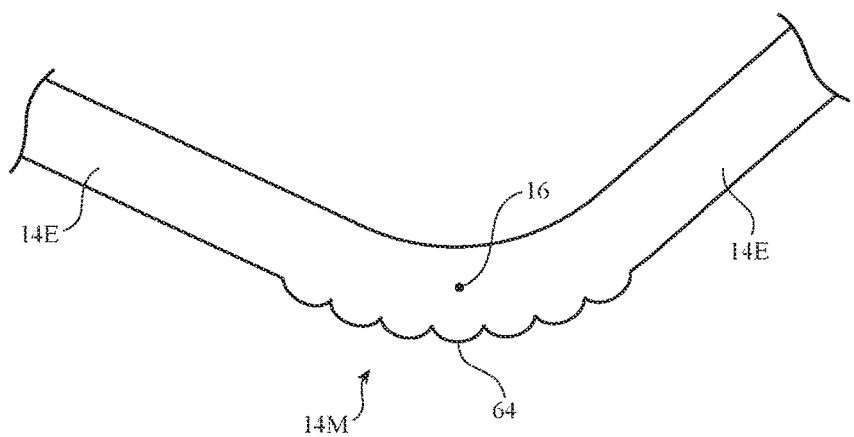

As shown in the cross-sectional side view of display 14 of FIG. 21A, one or more of the layers of display 14 (e.g., backing layer 14-1) may be provided with protrusions that help provide support while retaining flexibility. In the example of FIG. 21A, a layer of display 14 has series of parallel ribs 64 in region 14M (i.e., elongated raised portions that run parallel to bend axis 16). FIG. 21B shows how the depressed regions between adjacent pairs of ribs may help enhance the flexibility by facilitating bending around bend axis 16.

Display 14 may have a touch sensor. The touch sensor may be a stand-alone capacitive touch sensor layer such as layer 14-5 of FIG. 8 or may be formed from capacitive touch sensor electrodes that have been integrated into display 14-3.

Figure 22:
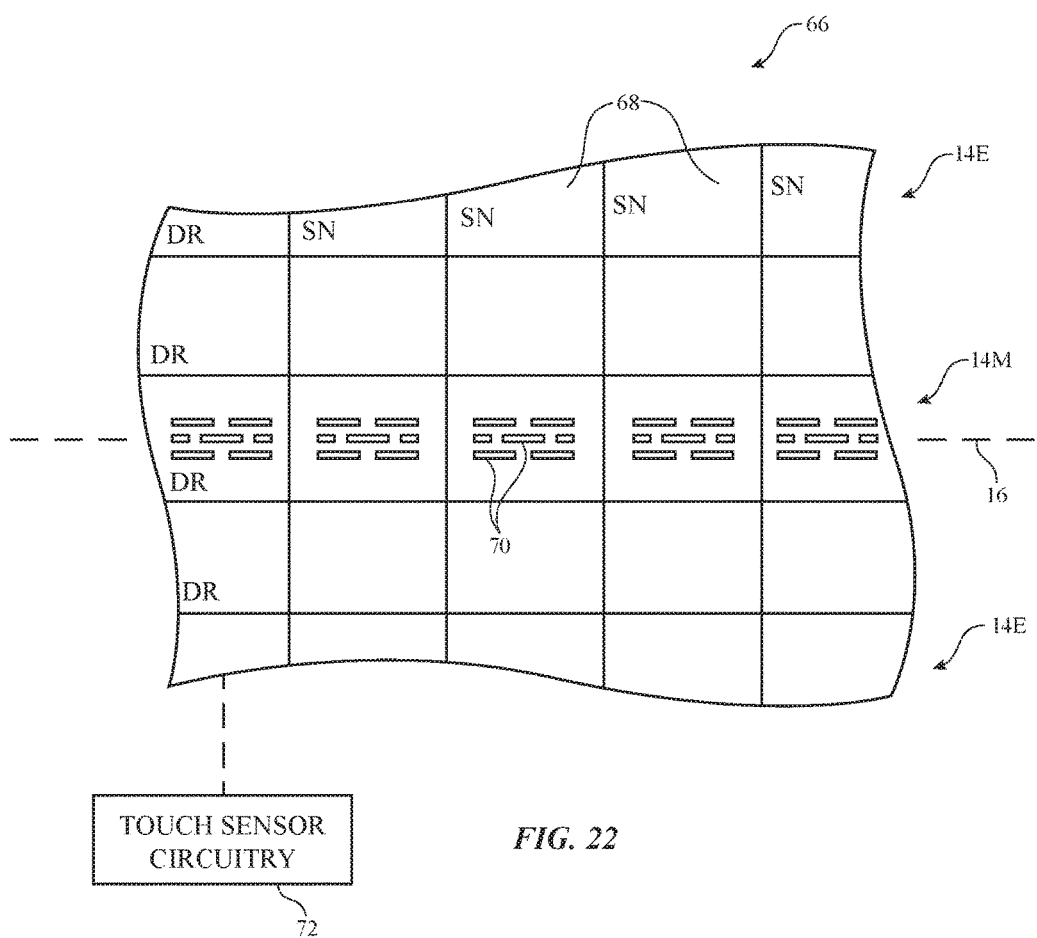
FIG. 22 is a diagram showing how a touch sensor may be provided with enhanced flexibility regions in accordance with an embodiment.

A top view of an illustrative touch sensor is shown in FIG. 22. As shown in FIG. 22, touch sensor 66 may have drive lines DR and perpendicular sense lines SN. Touch sensor circuitry 72 may be coupled to drive lines DR and to sense lines SN. Touch sensor circuitry 72 may supply drive signals to drive lines DR and may monitor sense lines SN for signals that have been coupled into a given sense line SN from one of drive lines DR due to the presence of a user's finger or other overlapping external component (e.g., a stylus) at the intersection between that drive line and sense line.

Capacitive touch sensors may use single-sided or double-sided electrode patterns. Capacitive touch sensor electrodes may be formed from transparent conductive material such as indium tin oxide. As an example, each drive line DR in sensor 66 of FIG. 22 may be formed from a horizontal strip of indium tin oxide on the upper surface of a clear plastic substrate and each sense line SN in sensor 66 may be formed from a vertical strip of indium tin oxide on the lower surface of the clear plastic substrate. Enhanced flexibility regions 70 may be formed in the substrate layer and/or electrode layer(s) of touch sensor 66. Regions 70 may, for example, run along and overlap bend axis 16, as shown in FIG. 22. Regions 70 may be formed from staggered slots or other elongated openings in the indium tin oxide layers and/or the clear plastic substrate, from grooves or other recesses in these layers, etc. The area consumed by regions 70 may be relatively small and there may be spaces between regions 70, so the presence of the enhanced flexibility regions 70 may only slightly raise the resistance of the touch sensor electrodes, thereby ensuring that touch sensor 66 may operate satisfactorily.

Figure 23:
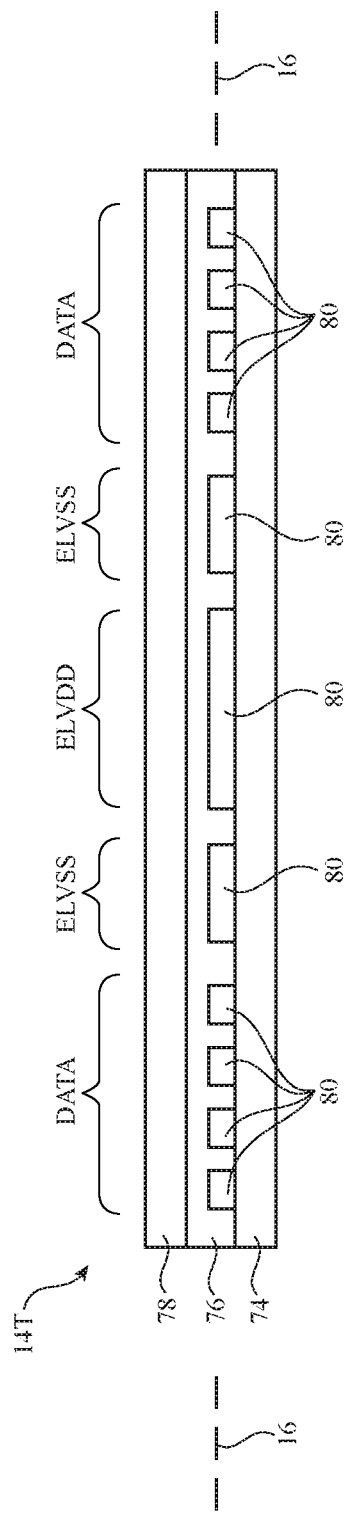
FIG. 23 is a cross-sectional side view of an illustrative flexible display structure with metal traces for data and power signals in accordance with an embodiment.

FIG. 23 is a cross-sectional side view of a portion of display 14 (e.g., a portion in an inactive tail region such as region 14T of FIG. 7). As shown in FIG. 23, a display portion such as portion 14T may have a substrate such as substrate 74 (e.g., a layer of polyimide or other flexible polymer layer). Metal traces 80 may be patterned onto layer 74 and used to form data line signal paths (DATA) and power paths (e.g., positive power supply path ELVDD and a pair of flanking ground power supply paths ELVSS in the FIG. 23 example). Planarization layer 76 may be formed from a polymer layer that is deposited as a liquid and that remains flexible when cured to a solid state. Optional neutral stress plane adjustment layer 78 may be formed on top of layer 76 and may be used to ensure that the neutral stress plane of tail 14T is aligned with metal traces 80 when tail 14T is bent about bend axis 16 as shown in FIG. 7, thereby minimizing bending-induced stress in traces 80. By minimizing stress in traces 80, faults due to trace cracks may be avoided.

Figure 24:
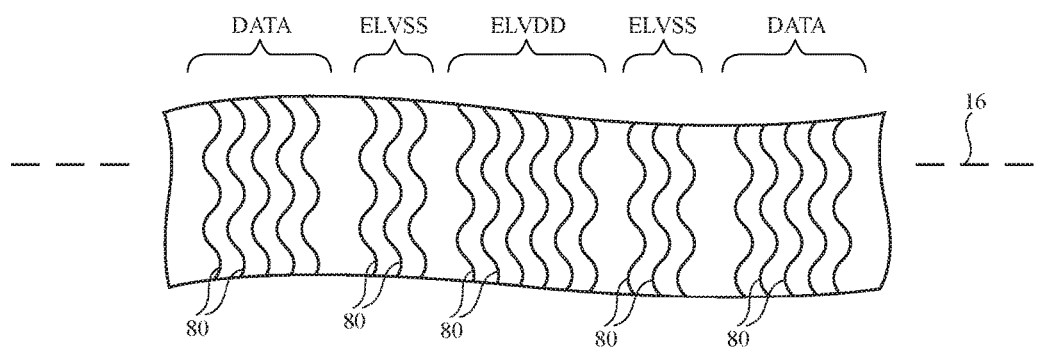
FIGS. 24, 25, and 26 are top views of illustrative metal trace patterns for bendable display structures in accordance with an embodiment.
Figure 25:
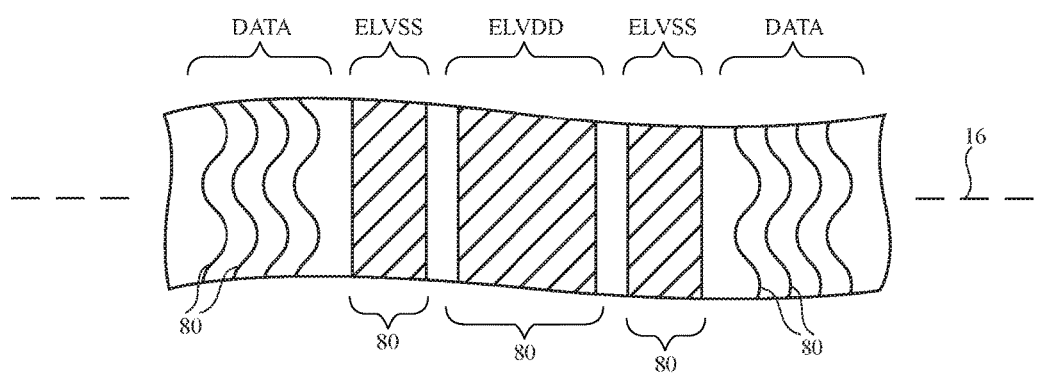
Figure 26:
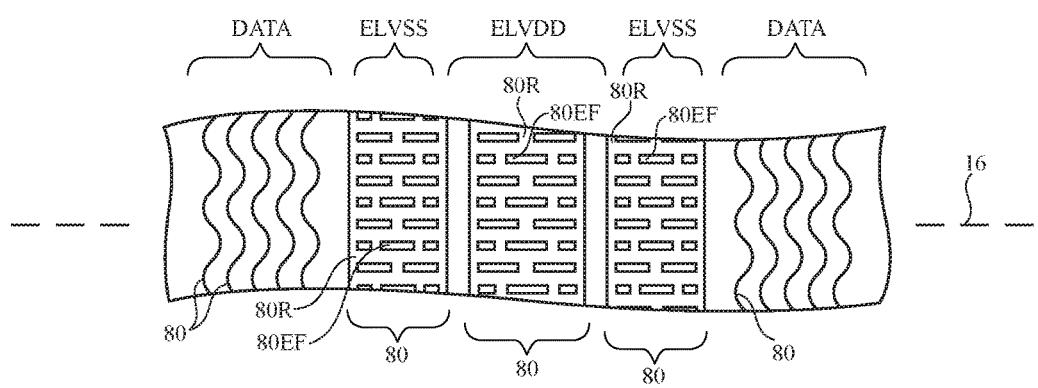

Stress that has the potential to lead to undesired cracks in metal traces 80 may also be minimized by selection of appropriate shapes for traces 80 in the portion of traces 80 that runs across bend axis 16. In the example of FIG. 24, traces 80 for DATA, ELVSS, and ELVDD have serpentine shapes (i.e., the traces are serpentine metal lines). This may help minimize trace stress, because serpentine paths can stretch slightly when bent about axis 16. In the example of FIG. 25, data lines DATA are formed from serpentine traces 80 and power lines (e.g., ELVSS and ELVDD) have been formed from solid metal trace strips to help reduce power line resistance. FIG. 26 shows how solid metal trace strips for power traces such as ELVSS and ELVDD (i.e., metal trace strips 80R) may be provided with flexibility enhancement regions 80EF. Flexibility enhancement regions 80EF may be, for example, staggered slots or other elongated openings that pass through traces 80R or may be openings of other suitable shapes. Regions 80EF do not completely span the widths of traces 80R, so traces 80R remain conductive. If desired, patterned thin-film metal traces such as the traces of FIGS. 24, 25, and/or 26 or other serpentine traces and/or traces with openings that serve as flexibility enhancement regions may be formed in multiple layers of a display and may be shorted together using metal vias.

The foregoing is merely illustrative and various modifications can be made by those skilled in the art without departing from the scope and spirit of the described embodiments. The foregoing embodiments may be implemented individually or in any combination.

What is claimed is:

1. An electronic device that folds about a bend axis, comprising:
   a housing having edge portions and having a middle portion that is coupled between the edge portions; and
   a flexible display having edge portions in the edge portions of the housing and having a flexible middle portion that overlaps the middle portion of the housing, wherein the flexible display has a backing layer, a flexible organic light-emitting diode display layer, and a polarizer layer, wherein at least the backing layer has a plurality of elongated flexibility enhancement regions in the flexible middle portion, wherein each of the elongated flexibility enhancement regions extends along the bend axis to enhance flexibility of the flexible middle portion of the flexible display as the flexible display bends about the bend axis, wherein the polarizer has an index of refraction, and wherein the polarizer has recesses that are filled with material having an index of refraction that is matched to the index of refraction of the polarizer.

2. The electronic device defined in claim 1 wherein the elongated flexibility enhancement regions comprise staggered slots.

3. The electronic device defined in claim 2 wherein the slots extend through the backing layer.

4. The electronic device defined in claim 2 wherein the slots extend only partway through the backing layer.

5. The electronic device defined in claim 4 wherein the slots include slots of different depths.

6. The electronic device defined in claim 2 further comprising elastomeric material in the slots.

7. The electronic device defined in claim 2 wherein the slots are laser-formed openings and wherein the backing layer comprises a polymer layer through which the laser-formed openings pass.

8. An electronic device that folds about a bend axis, comprising:
   a housing having edge portions and having a middle portion that is coupled between the edge portions; and a flexible display having edge portions in the edge portions of the housing and having a flexible middle portion that overlaps the middle portion of the housing, wherein the flexible display has a backing layer, a flexible organic light-emitting diode display layer, and a polarizer layer, wherein at least the backing layer has a plurality of elongated flexibility enhancement regions in the flexible middle portion and wherein each of the elongated flexibility enhancement regions extends along the bend axis to enhance flexibility of the flexible middle portion of the flexible display as the flexible display bends about the bend axis, and wherein the plurality of elongated flexibility enhancement regions are arranged with a density that decreases with increasing distance from the bend axis.

9. The electronic device defined in claim 8, wherein the elongated flexibility enhancement features comprise openings that extend completely through the backing layer.

10. The electronic device defined in claim 8, wherein the flexible display comprises an array of display pixels that overlaps the edge portions and the flexible middle portion of the flexible display.

11. The electronic device defined in claim 10, wherein the flexible display is configured to be folded along the bend axis such that portions of the array of display pixels that overlap the edge portions face each other.

12. An electronic device that folds about a bend axis, comprising:
a housing having edge portions and having a middle portion that is coupled between the edge portions; and
a flexible display having edge portions in the edge portions of the housing and having a flexible middle portion that overlaps the middle portion of the housing, wherein the flexible display has a backing layer, a flexible organic light-emitting diode display layer, and a polarizer layer, wherein at least the backing layer has a plurality of elongated flexibility enhancement regions in the flexible middle portion and wherein each of the elongated flexibility enhancement regions extends along the bend axis to enhance flexibility of the flexible middle portion of the flexible display as the flexible display bends about the bend axis, wherein the backing layer is a layer of polymer, and wherein the flexibility enhancement regions are at least partially uncured portions of the layer of polymer surrounded by cured portions of the layer of polymer.

13. The electronic device defined in claim 12, wherein the elongated flexibility enhancement features comprise at least partially uncured portions of the layer of polymer that extend completely through the backing layer.

14. The electronic device defined in claim 12, wherein the elongated flexibility enhancement features comprise at least partially uncured portions of the layer of polymer that extend only partially through the backing layer.

15. The electronic device defined in claim 12, wherein the flexible display comprises an array of display pixels that overlaps the edge portions and the flexible middle portion of the flexible display.

16. The electronic device defined in claim 15, wherein the flexible display is configured to be folded along the bend axis such that portions of the array of display pixels that overlap the edge portions face each other.

* * * * *